(12) United States Patent
Shimokawa et al.

(10) Patent No.: US 10,438,935 B1
(45) Date of Patent: Oct. 8, 2019

(54) SEMICONDUCTOR DEVICE

(71) Applicant: TOSHIBA MEMORY CORPORATION, Minato-ku (JP)

(72) Inventors: Kazuo Shimokawa, Yokohama (JP); Masayuki Uchida, Yokohama (JP); Akira Tojo, Naka (JP); Masatoshi Tanabe, Yokohama (JP); Takashi Ito, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/119,624

(22) Filed: Aug. 31, 2018

(30) Foreign Application Priority Data

Mar. 15, 2018 (JP) .................................. 2018-048046

(51) Int. Cl.
*H01L 23/02* (2006.01)
*H01L 25/11* (2006.01)
*H01L 23/00* (2006.01)
*H01L 23/538* (2006.01)

(52) U.S. Cl.
CPC ........ *H01L 25/117* (2013.01); *H01L 23/5385* (2013.01); *H01L 23/5386* (2013.01); *H01L 24/82* (2013.01); *H01L 24/95* (2013.01); *H01L 2224/24145* (2013.01)

(58) Field of Classification Search
CPC ....... H01L 2224/32145; H01L 2224/97; H01L 2224/48145; H01L 25/06757; H01L 24/49; H01L 2225/0651; H01L 2224/85; H01L 24/45; H01L 2224/16145
USPC .................................................. 257/686, 777
See application file for complete search history.

(56) References Cited

U.S. PATENT DOCUMENTS

| 6,514,794 | B2 * | 2/2003 | Haba .................. H01L 23/3128 438/109 |
| 7,705,468 | B2 * | 4/2010 | Joh ..................... H01L 25/0657 257/685 |
| 7,989,943 | B2 * | 8/2011 | Kim ........................ H01L 24/24 257/686 |

(Continued)

FOREIGN PATENT DOCUMENTS

| JP | 2009-158739 | 7/2009 |
| JP | 4498403 | 7/2010 |

(Continued)

*Primary Examiner* — S. V. Clark
(74) *Attorney, Agent, or Firm* — Oblon, McClelland, Maier & Neustadt, L.L.P.

(57) ABSTRACT

According to one embodiment, the first end part of the first semiconductor chip in a lower stage protrudes to a larger extent in a first direction than the first end part of the first semiconductor chip in an upper stage. The second end part of the second semiconductor chip in a lower stage protrudes to a larger extent in a second direction opposite from the first direction than the second end part of the second semiconductor chip in an upper stage. The first interlayer semiconductor chip includes a first portion, a second portion, and a third electrode pad. The first portion overlaps the first chip group. The second portion protrudes in the second direction beyond the first chip group and the second chip group and is thicker than the first portion. The third electrode pad is provided on the second portion and bonded with the third metal wire.

15 Claims, 7 Drawing Sheets

(56) References Cited

U.S. PATENT DOCUMENTS

| | | | |
|---|---|---|---|
| 8,242,607 B2 * | 8/2012 | Chin | H01L 24/49 257/777 |
| 2008/0150158 A1 * | 6/2008 | Chin | H01L 24/49 257/777 |
| 2009/0108470 A1 | 4/2009 | Okada et al. | |
| 2009/0166829 A1 | 7/2009 | Nishiyama et al. | |
| 2010/0200976 A1 | 8/2010 | Nishiyama et al. | |
| 2010/0283140 A1 * | 11/2010 | Kim | H01L 23/3128 257/686 |
| 2012/0149151 A1 | 6/2012 | Tane et al. | |

FOREIGN PATENT DOCUMENTS

| | | |
|---|---|---|
| JP | 2012-124423 | 6/2012 |
| JP | 5178213 | 4/2013 |

* cited by examiner

SEMICONDUCTOR DEVICE

CROSS-REFERENCE TO RELATED APPLICATION

This application is based upon and claims the benefit of priority from Japanese Patent Application No. 2018-048046, filed on Mar. 15, 2018; the entire contents of which are incorporated herein by reference.

FIELD

Embodiments described herein relate generally to a semiconductor device.

BACKGROUND

A semiconductor device including an interconnect substrate, a first element group stacked on the interconnect substrate, and a second element group stacked on the first element group is known. A plurality of chips of the first element group are stacked in a staircase configuration so that each pad arrangement side is directed in the same direction and the electrode pads do not overlap each other. A plurality of chips of the second element group are stacked in a staircase configuration directed opposite to the staircase part of the first element group so that each pad arrangement side is directed in the same direction and the electrode pads do not overlap each other. In such a semiconductor device, it is proposed that the thickness of the lowermost chip of the plurality of chips of the second element group be made thicker than the thickness of the other chips.

BRIEF DESCRIPTION OF THE DRAWINGS

FIG. 4A to FIG. 8C are schematic sectional views showing a method for manufacturing the semiconductor device according to the embodiment of the invention;

DETAILED DESCRIPTION

According to one embodiment, a semiconductor device includes an interconnect substrate, a first chip group, a second chip group, a first interlayer semiconductor chip, a first metal wire, a second metal wire, and a third metal wire. The first chip group includes a plurality of first semiconductor chips stacked in a staircase configuration on the interconnect substrate. The second chip group includes a plurality of second semiconductor chips stacked in a staircase configuration on the first chip group. The first interlayer semiconductor chip is provided between the first chip group and the second chip group. The first metal wire connects the first chip group and the interconnect substrate. The second metal wire connects the second chip group and the interconnect substrate. The third metal wire connects the first interlayer semiconductor chip and the interconnect substrate. Each of the plurality of first semiconductor chips includes a first end part and a first electrode pad provided on the first end part and bonded with the first metal wire. The first end part of the first semiconductor chip in a lower stage protrudes to a larger extent in a first direction than the first end part of the first semiconductor chip in an upper stage. Each of the plurality of second semiconductor chips includes a second end part and a second electrode pad provided on the second end part and bonded with the second metal wire. The second end part of the second semiconductor chip in a lower stage protrudes to a larger extent in a second direction opposite from the first direction than the second end part of the second semiconductor chip in an upper stage. The first interlayer semiconductor chip includes a first portion, a second portion, and a third electrode pad. The first portion overlaps the first chip group. The second portion protrudes in the second direction beyond the first chip group and the second chip group and is thicker than the first portion. The third electrode pad is provided on the second portion and bonded with the third metal wire.

Embodiments are described below with reference to the drawings. In the drawings, the same components are denoted by the same reference numerals and signs.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

Figure 1:
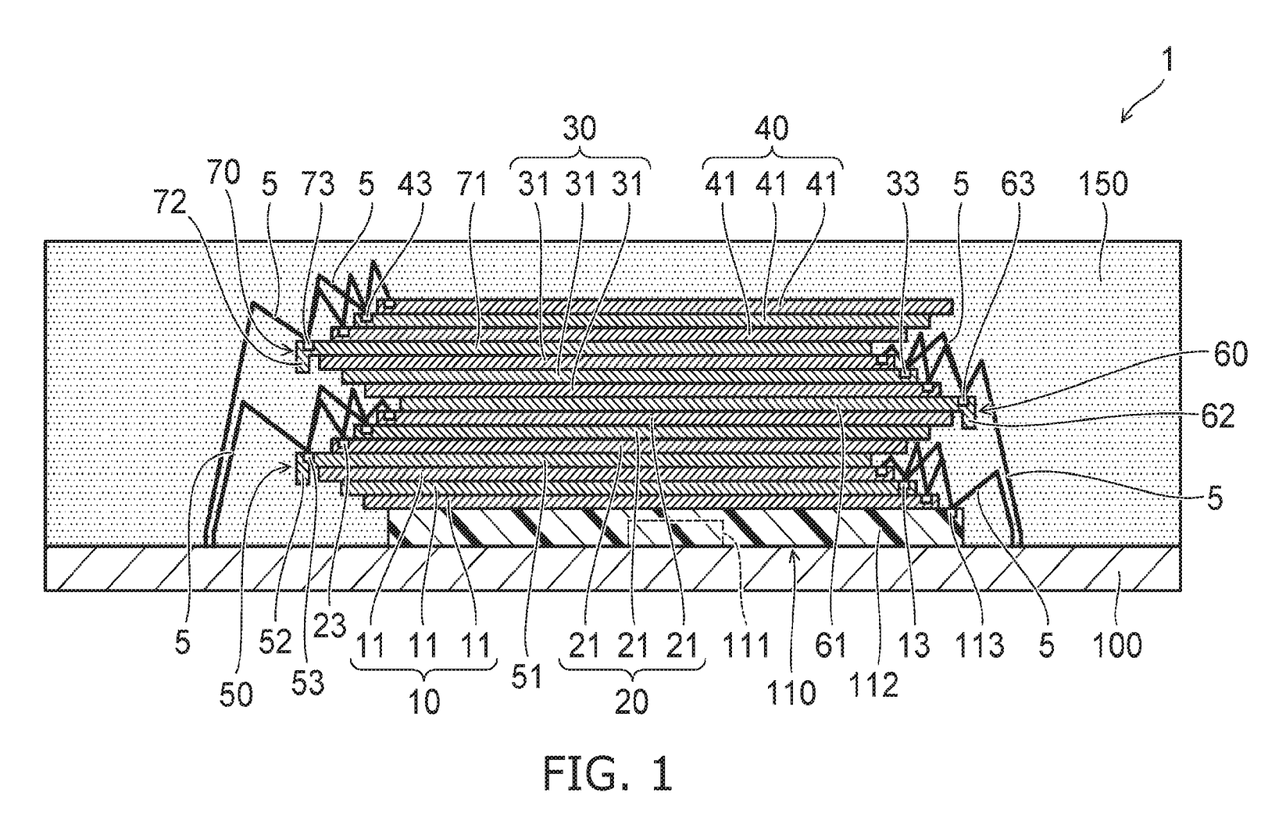
FIG. 1 is a schematic sectional view of a semiconductor device according to an embodiment of the invention.

FIG. 1 is a schematic sectional view of a semiconductor device 1 according to an embodiment of the invention.

The semiconductor device 1 includes an interconnect substrate 100, chip groups 10, 20, 30, 40 including a plurality of semiconductor chips stacked on the interconnect substrate 100, metal wires 5 connecting the semiconductor chips and the interconnect substrate 100, and a resin part 150 sealing the plurality of semiconductor chips and the metal wires 5.

In the example shown in FIG. 1, four chip groups (a first chip group 10, a second chip group 20, a third chip group 30, and a fourth chip group 40) are stacked on the interconnect substrate 100.

The first chip group 10 includes a plurality of semiconductor chips 11 stacked in a staircase configuration on the interconnect substrate 100. The second chip group 20 includes a plurality of semiconductor chips 21 stacked in a staircase configuration on the first chip group 10. The third chip group 30 includes a plurality of semiconductor chips 31 stacked in a staircase configuration on the second chip group 20. The fourth chip group 40 includes a plurality of semiconductor chips 41 stacked in a staircase configuration on the third chip group 30.

Each of the plurality of semiconductor chips 11 of the first chip group 10 has an end part (the end part on the right side in FIG. 1) bonded with a metal wire 5. A plurality of end parts of the plurality of semiconductor chips 11 form step differences and are arranged in a staircase configuration. The end part of the semiconductor chip 11 in the lower stage protrudes to a larger extent in a first direction (the right direction in FIG. 1) than the end part of the semiconductor chip 11 in the upper stage.

The end part of each semiconductor chip 11 is provided with an electrode pad 13. Each electrode pad 13 is not covered with the other semiconductor chips. The semiconductor chip has a quadrangular planar shape having four sides. A plurality of electrode pads 13 are arranged along one side of the semiconductor chip 11.

The metal wire 5 is bonded to the electrode pad 13. The metal wire 5 connects the electrode pad 13 and an interconnect, not shown, of the interconnect substrate 100. The metal wire 5 connects the electrode pads 13 to each other.

Each of the plurality of semiconductor chips 21 of the second chip group 20 has an end part (the end part on the left side in FIG. 1) bonded with a metal wire 5. A plurality of end parts of the plurality of semiconductor chips 21 form step differences and are arranged in a staircase configuration. The end part of the semiconductor chip 21 in the lower stage protrudes to a larger extent in a second direction (the left direction in FIG. 1) opposite from the first direction than the end part of the semiconductor chip 21 in the upper stage.

The end part of each semiconductor chip 21 is provided with an electrode pad 23. Each electrode pad 23 is not covered with the other semiconductor chips. The semiconductor chip has a quadrangular planar shape having four sides. A plurality of electrode pads 23 are arranged along one side of the semiconductor chip 21.

The metal wire 5 is bonded to the electrode pad 23. The metal wire 5 connects the electrode pad 23 and an interconnect, not shown, of the interconnect substrate 100. The metal wire 5 connects the electrode pads 23 to each other.

Each of the plurality of semiconductor chips 31 of the third chip group 30 has an end part (the end part on the right side in FIG. 1) bonded with a metal wire 5. A plurality of end parts of the plurality of semiconductor chips 31 form step differences and are arranged in a staircase configuration. The end part of the semiconductor chip 31 in the lower stage protrudes to a larger extent in the first direction (the right direction in FIG. 1) than the end part of the semiconductor chip 31 in the upper stage.

The end part of each semiconductor chip 31 is provided with an electrode pad 33. Each electrode pad 33 is not covered with the other semiconductor chips. The semiconductor chip 31 has a quadrangular planar shape having four sides. A plurality of electrode pads 33 are arranged along one side of the semiconductor chip 31.

The metal wire 5 is bonded to the electrode pad 33. The metal wire 5 connects the electrode pad 33 and an interconnect, not shown, of the interconnect substrate 100. The metal wire 5 connects the electrode pads 33 to each other.

Each of the plurality of semiconductor chips 41 of the fourth chip group 40 has an end part (the end part on the left side in FIG. 1) bonded with a metal wire 5. A plurality of end parts of the plurality of semiconductor chips 41 form step differences and are arranged in a staircase configuration. The end part of the semiconductor chip 41 in the lower stage protrudes to a larger extent in the second direction (the left direction in FIG. 1) than the end part of the semiconductor chip 41 in the upper stage.

The end part of each semiconductor chip 41 is provided with an electrode pad 43. Each electrode pad 43 is not covered with the other semiconductor chips. The semiconductor chip has a quadrangular planar shape having four sides. A plurality of electrode pads 43 are arranged along one side of the semiconductor chip 41.

The metal wire 5 is bonded to the electrode pad 43. The metal wire 5 connects the electrode pad 43 and an interconnect, not shown, of the interconnect substrate 100. The metal wire 5 connects the electrode pads 43 to each other.

The semiconductor chips 11, 21, 31, 41 of the first chip group 10, the second chip group 20, the third chip group 30, and the fourth chip group 40 have a thickness substantially uniform in all the regions in the planar direction.

A semiconductor chip 50 is provided between the first chip group 10 and the second chip group 20. The semiconductor chip 50 is an interlayer semiconductor chip provided between the chip groups.

Figure 2:
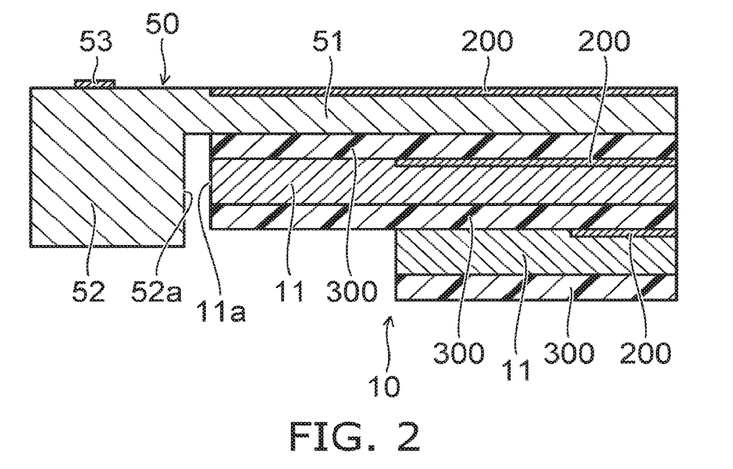
FIG. 2 is a schematic enlarged sectional view of a portion of the semiconductor device according to the embodiment of the invention.

FIG. 2 is a schematic enlarged sectional view of a portion of the semiconductor chip 50.

Figure 3:
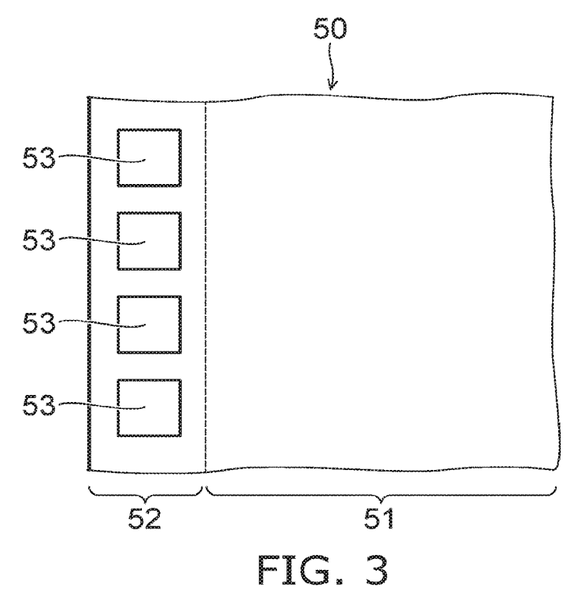
FIG. 3 is a schematic enlarged plan view of a portion of the semiconductor device according to the embodiment of the invention.

FIG. 3 is a schematic enlarged plan view of a portion of the semiconductor chip 50.

The semiconductor chip 50 includes a first portion 51 and a second portion 52. The first portion 51 overlaps the first chip group 10. The second portion 52 protrudes in the second direction (the left direction in FIGS. 1 and 2) beyond the first chip group 10 and the second chip group 20. The second portion 52 does not overlap the first chip group 10, and does not underlap the second chip group 20.

The thickness of the second portion 52 is thicker than the thickness of the first portion 51. The thickness of the second portion 52 is thicker than the thickness of one semiconductor chip 11, 21, 31, 41. The thickness of the second portion 52 of the semiconductor chip 50 is thinner than the total thickness of the first chip group 10. The second portion 52 is not in contact with the interconnect substrate 100.

The second portion 52 is provided with an electrode pad 53. The electrode pad 53 is not covered with the other semiconductor chips. The semiconductor chip 50 has a quadrangular planar shape having four sides. As shown in FIG. 3, a plurality of electrode pads 53 are arranged along one side of the semiconductor chip 50. The second portion 52 extends along the arrangement direction of the plurality of electrode pads 53.

As shown in FIG. 1, a metal wire 5 is bonded to the electrode pad 53. The metal wire 5 connects the electrode pad 53 and an interconnect, not shown, of the interconnect substrate 100. The metal wire 5 bonded to the electrode pad of the other semiconductor chip 21 is bonded to the electrode pad 53.

As shown in FIG. 1, a semiconductor chip 60 is provided between the second chip group 20 and the third chip group 30. The semiconductor chip 60 is an interlayer semiconductor chip provided between the chip groups.

The semiconductor chip 60 includes a first portion 61 and a second portion 62. The first portion 61 overlaps the second chip group 20. The second portion 62 protrudes in the first direction (the right direction in FIG. 1) beyond the second chip group 20 and the third chip group 30. The second portion 62 does not overlap the second chip group 20, and does not underlap the third chip group 30.

The thickness of the second portion 62 is thicker than the thickness of the first portion 61. The thickness of the second portion 62 is thicker than the thickness of one semiconductor chip 11, 21, 31, 41. The thickness of the second portion 62 of the semiconductor chip 60 is thinner than the total thickness of the second chip group 20.

The second portion 62 is provided with an electrode pad 63. The electrode pad 63 is not covered with the other semiconductor chips. The semiconductor chip 60 has a quadrangular planar shape having four sides. A plurality of electrode pads 63 are arranged along one side of the semiconductor chip 60.

A metal wire 5 is bonded to the electrode pad 63. The metal wire 5 connects the electrode pad 63 and an interconnect, not shown, of the interconnect substrate 100. The metal wire 5 bonded to the electrode pad 33 of the other semiconductor chip 31 is bonded to the electrode pad 63.

As shown in FIG. 1, a semiconductor chip 70 is provided between the third chip group 30 and the fourth chip group 40. The semiconductor chip 70 is an interlayer semiconductor chip provided between the chip groups.

The semiconductor chip 70 includes a first portion 71 and a second portion 72. The first portion 71 overlaps the third chip group 30. The second portion 72 protrudes in the second direction (the left direction in FIG. 1) beyond the third chip group 30 and the fourth chip group 40. The second portion 72 does not overlap the third chip group 30, and does not underlap the fourth chip group 40.

The thickness of the second portion 72 is thicker than the thickness of the first portion 71. The thickness of the second portion 72 is thicker than the thickness of one semiconductor chip 11, 21, 31, 41. The thickness of the second portion 72 of the semiconductor chip 70 is thinner than the total thickness of the third chip group 30.

The second portion 72 is provided with an electrode pad 73. The electrode pad 73 is not covered with the other semiconductor chips. The semiconductor chip 70 has a quadrangular planar shape having four sides. A plurality of electrode pads 73 are arranged along one side of the semiconductor chip 70.

A metal wire 5 is bonded to the electrode pad 73. The metal wire 5 connects the electrode pad 73 and an interconnect, not shown, of the interconnect substrate 100. The metal wire 5 bonded to the electrode pad 43 of the other semiconductor chip 41 is bonded to the electrode pad 73.

A resin layer 300 (part of the resin layer 300 being shown in FIG. 2) is provided between the semiconductor chips 11, between the semiconductor chips 21, between the semiconductor chips 31, and between the semiconductor chips 41. The resin layer 300 is e.g. DAF (die attach film).

The resin layer 300 is provided also between the uppermost semiconductor chip 11 of the first chip group 10 and the semiconductor chip 50, between the semiconductor chip 50 and the lowermost semiconductor chip 21 of the second chip group 20, between the uppermost semiconductor chip 21 of the second chip group 20 and the semiconductor chip 60, between the semiconductor chip 60 and the lowermost semiconductor chip 31 of the third chip group 30, between the uppermost semiconductor chip 31 of the third chip group 30 and the semiconductor chip 70, and between the semiconductor chip 70 and the lowermost semiconductor chip 41 of the fourth chip group 40.

As shown in FIG. 2, the side surface 52a of the second portion 52 of the semiconductor chip 50 opposed to the first chip group 10 is spaced from the side surface 11a of the uppermost semiconductor chip 11 of the first chip group 10. A gap is formed between the side surface 52a of the second portion 52 and the side surface 11a of the uppermost semiconductor chip 11 of the first chip group 10.

The side surface of the second portion 62 of the semiconductor chip 60 opposed to the second chip group 20 between the second chip group 20 and the third chip group 30 is also spaced from the side surface of the uppermost semiconductor chip 21 of the second chip group 20. A gap is formed between the side surface of the second portion 62 and the side surface of the uppermost semiconductor chip 21 of the second chip group 20.

The side surface of the second portion 72 of the semiconductor chip 70 opposed to the third chip group 30 between the third chip group 30 and the fourth chip group 40 is also spaced from the side surface of the uppermost semiconductor chip 31 of the third chip group 30. A gap is formed between the side surface of the second portion 72 and the side surface of the uppermost semiconductor chip 31 of the third chip group 30.

As shown in FIG. 1, a control layer 110 is provided between the interconnect substrate 100 and the first chip group 10. The control layer 110 includes a resin layer 112, a control element 111 provided in the resin layer 112, and an electrode pad 113 connected to the control element 111. The electrode pad 113 of the control layer 110 is bonded with a metal wire 5. This metal wire 5 connects between the control element 111 and the interconnect substrate 100 and between the control element 111 and the semiconductor chip 11. The control layer 110 may be provided on the fourth chip group 40.

A resin part 150 is provided on the interconnect substrate 100. The resin part 150 covers the control layer 110, the semiconductor chips 11, 21, 31, 41, 50, 60, 70, and the metal wires 5.

The semiconductor chip 50 includes a memory element 200 as shown in FIG. 2. The other semiconductor chips 11, 21, 31, 41, 60, 70 also include a memory element. The memory element of the semiconductor chips 60, 70 is provided on the first portions 61, 71.

The control element 111 included in the control layer 110 controls the memory element 200.

Figure 10:
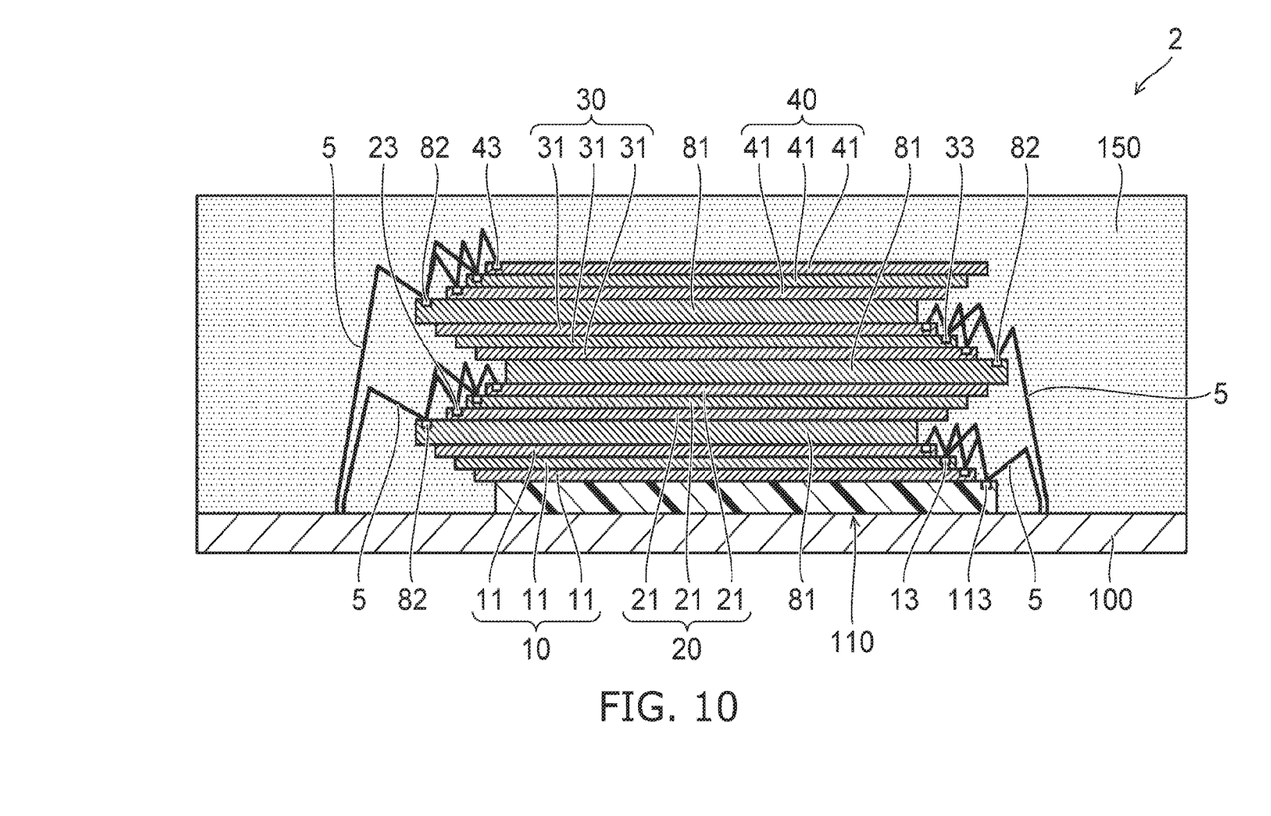
FIG. 10 is a schematic sectional view of a semiconductor device of a comparative example.

FIG. 10 is a schematic sectional view of a semiconductor device 2 of a comparative example.

The semiconductor device 2 of this comparative example is different from the semiconductor device 1 of the embodiment in that the thickness in all the regions in the planar direction of the semiconductor chips 81 between the first chip group 10 and the second chip group 20, between the second chip group 20 and the third chip group 30, and between the third chip group 30 and the fourth chip group 40 is substantially uniform.

A plurality of semiconductor chips are stacked in a staircase configuration. This enables wire bonding to each semiconductor chip. It is desired to suppress the increase of footprint in the planar direction of the plurality of semiconductor chips stacked in a staircase configuration. To this end, the end parts arranged in a staircase configuration provided with electrode pads are directed in opposite directions between the first chip group 10 and the second chip group 20, directed in opposite directions between the second chip group 20 and the third chip group 30, and further directed in opposite directions between the third chip group 30 and the fourth chip group 40.

In such a configuration, the end part provided with the electrode pad 82 of the semiconductor chip 81 provided between the chip groups 10, 20, 30, 40 overhangs with respect to the lower chip group. This produces a state in which there is no support by another semiconductor chip below the electrode pad 82. Performing wire bonding on this electrode pad 82 warps the semiconductor chip 81 by the load at the time of bonding. This may cause defective bonding of the metal wire 5. In particular, the end region in the extending direction (the depth direction in FIG. 10) of the side provided with the electrode pad 82 of the semiconductor chip 81 is more prone to warpage than in the central region. This is likely to increase the fraction defective of wire bonding to the electrode pad 82 formed in the end region.

The rigidity of a material is proportional to the cube of thickness. Thus, as shown in FIG. 10, the amount of warpage can be reduced by making the semiconductor chip 81 thicker than the other semiconductor chips 11, 21, 31, 41. However, this hampers thinning of the entire semiconductor device (package) and goes against the trend of products.

According to the embodiment, the semiconductor chip 50, 60, 70 has an end part having no support by another semiconductor chip therebelow and overhanging with respect to the lower chip group. The second portion 52, 62, 72 is an overhanging portion in the semiconductor chips 50, 60, 70. The thickness of the second portion 52, 62, 72 is made thicker than the first portion 51, 61, 71 stacked on the lower chip group. Thus, the rigidity of the second portion 52, 62, 72 can be improved. This can suppress deformation (warpage) of the semiconductor chip 50, 60, 70 at the time of wire bonding to the electrode pad 53, 63, 73 provided on the second portion 52, 62, 72. Thus, the wire bonding capability can be improved.

The thickened second portion 52, 62, 72 is a portion not overlapping or underlapping the chip groups 10, 20, 30, 40. Thus, the second portion 52, 62, 72 does not affect the total stacking thickness of the plurality of semiconductor chips. On the other hand, the thickness of the first portion 51, 61, 71 overlapping and underlapping the chip groups 10, 20, 30, 40 is made thinner than that of the second portion 52, 62, 72. This suppresses the increase of total thickness of the stacked body in which the plurality of semiconductor chips are stacked. Thus, the thinning of the semiconductor device 1 is not hampered. Accordingly, the embodiment enables compatibility between thinning of the entire semiconductor device and improvement in the wire bonding yield.

Next, a method for manufacturing the semiconductor device 1 according to the embodiment of the invention is described with reference to FIGS. 4A to 8C.

Figure 4A:
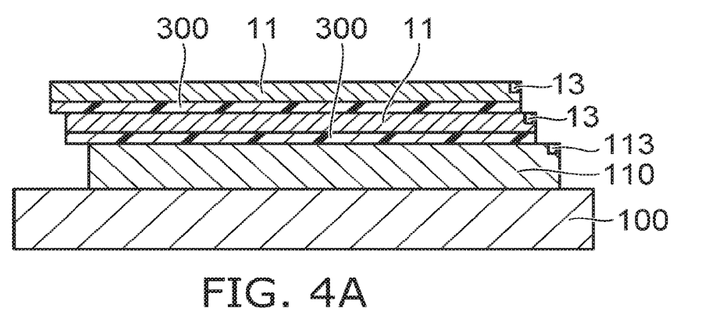

A shown in FIG. 4A, a control layer 110 is mounted on an interconnect substrate 100. A plurality of semiconductor chips of a first chip group 10 are stacked in a staircase configuration on the control layer 110. A resin layer 300 for bonding the lowermost semiconductor chip 11 to the control layer 110 is provided therebetween. A resin layer 300 for bonding the semiconductor chips 11 to each other is also provided therebetween.

For instance, the resin layer 300 is stuck to the lower surface of the semiconductor chip 11. Then, the semiconductor chip 11 with the resin layer 300 is mounted on the control layer 110 or another semiconductor chip 11.

Figure 6A:
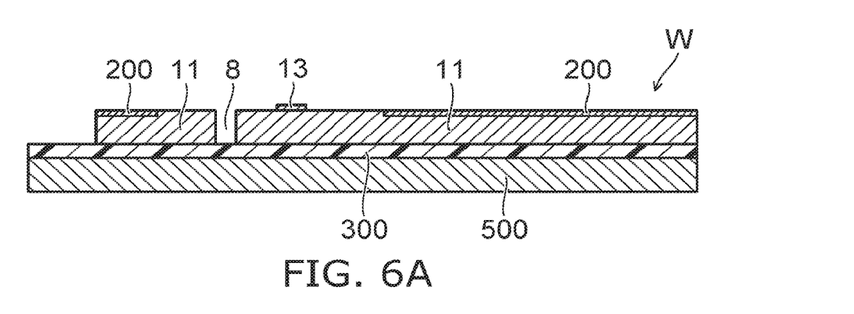

As shown in FIG. 6A, a resin layer (e.g. DAF) 300 is formed on the surface of a dicing tape 500. A wafer W is stuck onto the resin layer 300. A groove 8 is formed in the wafer W using e.g. a blade. Thus, the wafer W is singulated into a plurality of semiconductor chips 11.

Figure 6B:
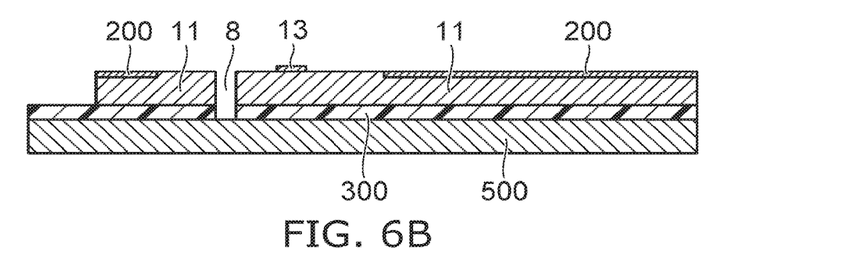

Then, as shown in FIG. 6B, the resin layer 300 below the groove 8 is cut using e.g. a laser. The semiconductor chip 11 with the resin layer 300 is stripped from the dicing tape 500 and mounted on the control layer 110 or another semiconductor chip 11 shown in FIG. 4A.

Figure 4B:
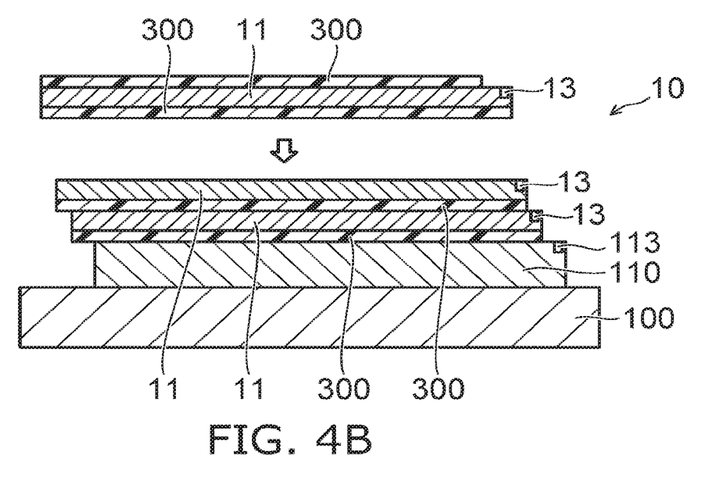

FIG. 4B shows a step for mounting the uppermost semiconductor chip 11 of the first chip group 10. A resin layer 300 is stuck to both the upper surface and the lower surface of the uppermost semiconductor chip 11 of the first chip group 10.

Figure 7A:
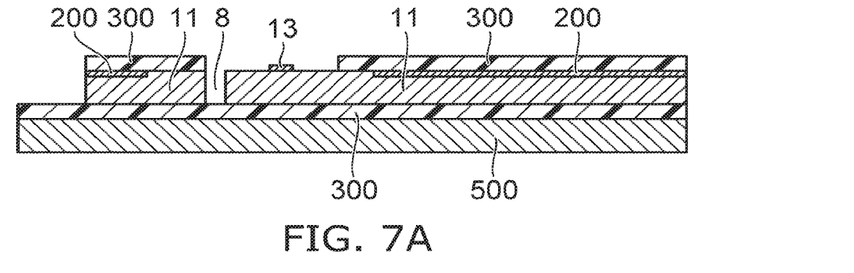

As shown in FIG. 7A, a resin layer 300 is patterned on the upper surface of the semiconductor chip 11 stuck to the resin layer 300 on the dicing tape 500. In the resin layer 300 provided on the upper surface of the semiconductor chip 11, an opening is formed so as to expose the electrode pad 13 provided on the end part of the semiconductor chip 11.

Figure 7B:
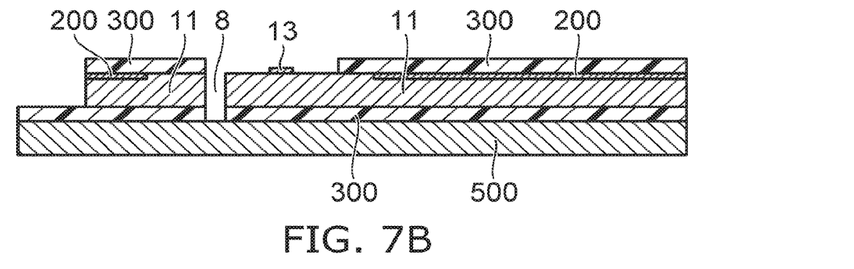

Then, as shown in FIG. 7B, the resin layer 300 below the groove 8 is cut using e.g. a laser.

Figure 5A:
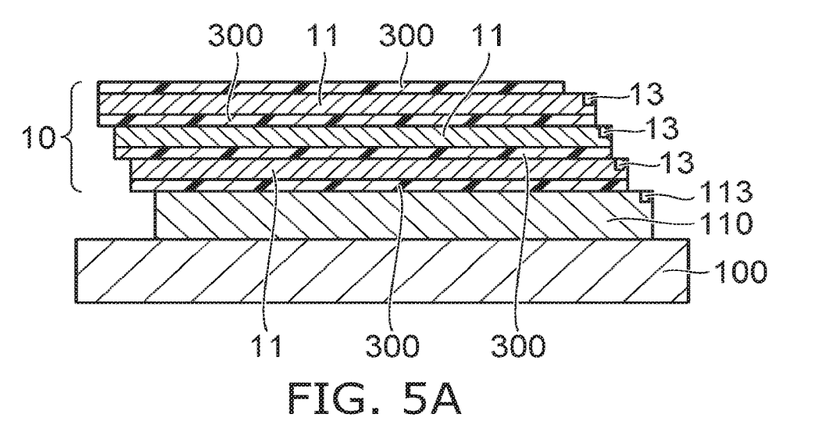

Thus, the uppermost semiconductor chip 11 is provided with resin layers 300 on the upper surface and the lower surface. Then, the uppermost semiconductor chip 11 is stripped from the dicing tape 500 and mounted on another semiconductor chip 11 as shown in FIG. 5A.

Figure 8A:
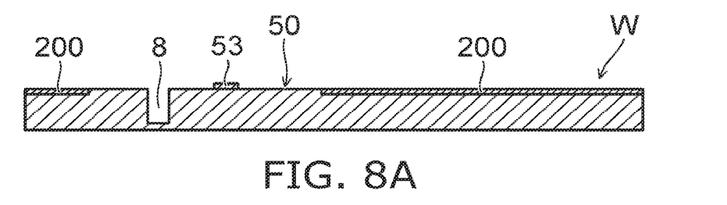
Figure 8B:
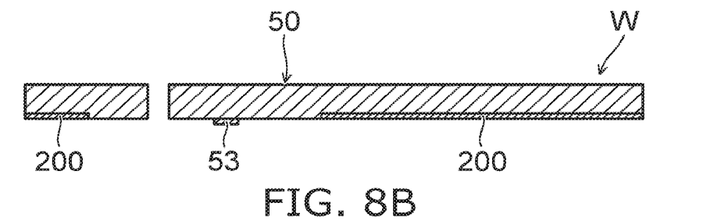
Figure 8C:
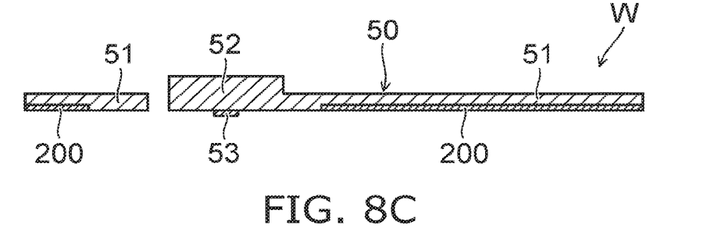

FIGS. 8A to 8C are schematic sectional views showing a method for forming a first portion 51 and a second portion 52 in the semiconductor chip 50.

As shown in FIG. 8A, a groove 8 is formed from the front surface side in the dicing region of the wafer W. A memory element 200 and an electrode pad 53 are formed on the front surface side of the wafer W. The depth of the groove 8 is set shallower than the thickness of the wafer W and deeper than the thickness at the time of completion of the singulated semiconductor chip 50.

Next, as shown in FIG. 8B, the wafer W is thinned by grinding the back surface of the wafer W. This grinding is performed until the groove 8 formed from the front surface side is exposed to the back surface side. The groove 8 reaches the front surface and the back surface of the wafer W. Thus, the wafer W is singulated into a plurality of semiconductor chips 50.

Next, as shown in FIG. 8C, wheel grinding is performed on a partial region of the back surface of the wafer W to form a first portion 51. The first portion 51 is thinner than a second portion 52 provided with the electrode pad 53.

Figure 5B:
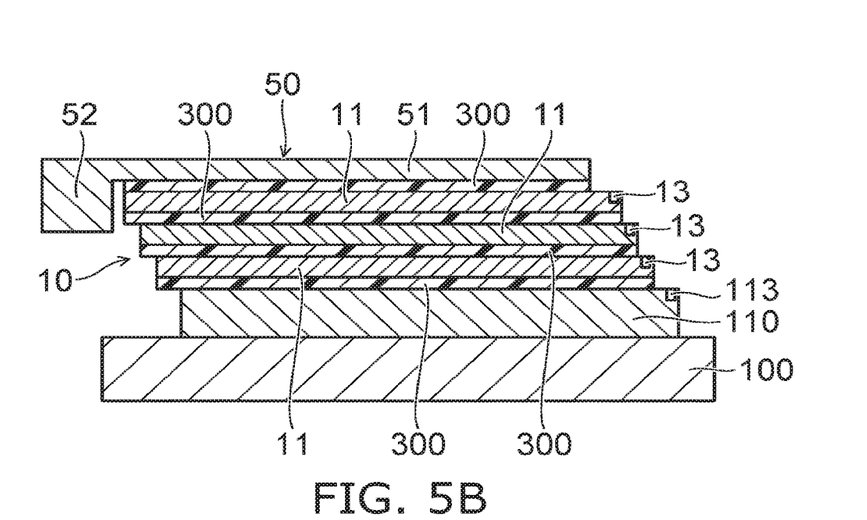

Thus, the semiconductor chip 50 is subjected to step difference processing. As shown in FIG. 5B, the semiconductor chip 50 is mounted on the uppermost semiconductor chip 11 of the first chip group 10. The first portion 51 of the semiconductor chip 50 is bonded to the resin layer 300 provided on the upper surface of the uppermost semiconductor chip 11. The second portion 52 of the semiconductor chip 50 overhangs from the first chip group 10 in the second direction (the left direction in FIG. 5B).

A step difference is formed on the back surface of the semiconductor chip 50. Thus, a resin layer 300 cannot be stuck to the back surface of the semiconductor chip 50. However, a resin layer 300 is previously stuck to the uppermost semiconductor chip 11 of the first chip group 10. This resin layer 300 enables bonding between the semiconductor chip 50 and the semiconductor chip 11.

The thickness or downward protruding amount of the second portion 52 of the semiconductor chip 50 is smaller than the total thickness of the first chip group 10. Thus, the second portion 52 does not abut on the interconnect substrate 100 at the time of mounting the semiconductor chip 50. This prevents damage to the semiconductor chip 50.

As shown in FIG. 2, the side surface 52a of the second portion 52 of the semiconductor chip 50 opposed to the first chip group 10 is spaced from the side surface 11a of the semiconductor chip 11. Thus, the second portion 52 does not abut on the semiconductor chip 11 at the time of mounting the semiconductor chip 50. This prevents damage to the semiconductor chip 50 and the semiconductor chip 11.

Subsequently, likewise, a plurality of semiconductor chips 21 of a second chip group 20 are stacked on the semiconductor chip 50. A semiconductor chip 60 is stacked on the uppermost semiconductor chip 21. A plurality of semiconductor chips 31 of a third chip group 30 are stacked on the semiconductor chip 60. A semiconductor chip 70 is stacked on the uppermost semiconductor chip 31. A plurality of semiconductor chips 41 of a fourth chip group 40 are stacked on the semiconductor chip 70. The semiconductor chip 60 and the semiconductor chip 70 are subjected to step difference processing like the semiconductor chip 50.

Figure 9:
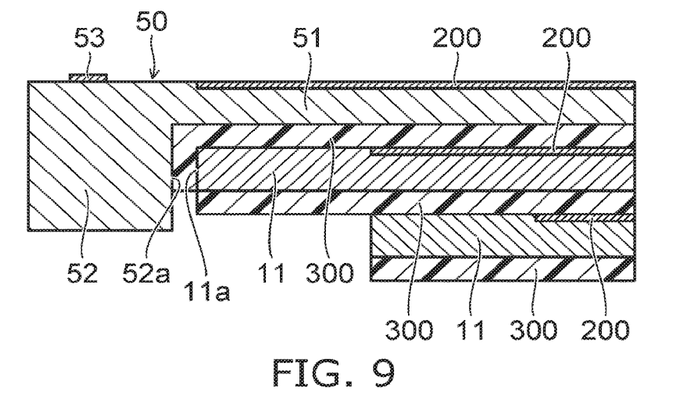
FIG. 9 is a schematic enlarged sectional view of a portion of the semiconductor device according to the embodiment of the invention.

FIG. 9 is a sectional view like FIG. 2, showing another example of the semiconductor device of the embodiment.

The thickness of the resin layer 300 stuck to the upper surface of the uppermost semiconductor chip 11 of the first chip group 10, or the load at the time of mounting the semiconductor chip 50, is controlled appropriately. Thus, the resin layer 300 sandwiched between the first portion 51 of the semiconductor chip 50 and the semiconductor chip 11 is extended out into the gap between the side surface 52a of the second portion 52 and the side surface 11a of the semiconductor chip 11. Accordingly, part of the resin layer 300 can be provided in the gap. The side surface 52a of the second portion 52 is supported by the side surface 11a of the semiconductor chip 11 via the resin layer 300. This can further increase the rigidity of the second portion 52 at the time of wire bonding to the electrode pad 53. The resin layer 300 may be extended out to the entire region of the side surface 52a of the second portion 52 of the semiconductor chip 50. The rigidity is further increased when the side surface 52a of the second portion 52 is entirely covered with the resin layer 300.

The example shown in FIG. 1 has illustrated a combination of four chip groups 10, 20, 30, 40 with three semiconductor chips 50, 60, 70 subjected to step difference processing. However, it is also possible to use a combination of two chip groups with one semiconductor chip subjected to step difference processing, a combination of three chip groups with two semiconductor chips subjected to step difference processing, or a combination of five or more chip groups with four or more semiconductor chips subjected to step difference processing.

The thickness of the semiconductor chip 11, the thickness of the semiconductor chip 21, the thickness of the semiconductor chip 31, and the thickness of the semiconductor chip 41 are generally equal. The thickness of the first portion 51 of the semiconductor chip 50, the thickness of the first portion 61 of the semiconductor chip 60, and the thickness of the first portion 71 of the semiconductor chip 70 are generally equal.

Alternatively, of the semiconductor chips 11, 21, 31, 41, the upper semiconductor chip may be made thicker. After stacking all the semiconductor chips, the resin layer (DAF) 300 is finally cured. Thus, increase in the number of stacked semiconductor chips results in increasing the number of resin layers 300 in a soft state, i.e. the total thickness of the plurality of resin layers 300. This may make the stacked body unstable. Thus, of the semiconductor chips 11, 21, 31, 41, the upper semiconductor chip is made thicker. This enables maintaining a stable stacked state of the plurality of semiconductor chips.

Likewise, of the first portion 51 of the semiconductor chip 50, the first portion 61 of the semiconductor chip 60, and the first portion 71 of the semiconductor chip 70, the first portion of the upper semiconductor chip may be made thicker.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device comprising:
an interconnect substrate;
a first chip group including a plurality of first semiconductor chips stacked in a staircase configuration on the interconnect substrate;
a second chip group including a plurality of second semiconductor chips stacked in a staircase configuration on the first chip group;
a first interlayer semiconductor chip provided between the first chip group and the second chip group;
a first metal wire connecting the first chip group and the interconnect substrate;
a second metal wire connecting the second chip group and the interconnect substrate; and
a third metal wire connecting the first interlayer semiconductor chip and the interconnect substrate,
each of the plurality of first semiconductor chips including a first end part and a first electrode pad provided on the first end part and bonded with the first metal wire, the first end part of the first semiconductor chip in a lower stage protruding to a larger extent in a first direction than the first end part of the first semiconductor chip in an upper stage,
each of the plurality of second semiconductor chips including a second end part and a second electrode pad provided on the second end part and bonded with the second metal wire, the second end part of the second semiconductor chip in a lower stage protruding to a larger extent in a second direction opposite from the first direction than the second end part of the second semiconductor chip in an upper stage, and
the first interlayer semiconductor chip including a first portion, a second portion, and a third electrode pad, the first portion overlapping the first chip group, the second portion protruding in the second direction beyond the first chip group and the second chip group and being thicker than the first portion, the third electrode pad provided on the second portion and bonded with the third metal wire.

2. The device according to claim 1, wherein a thickness of the second portion of the first interlayer semiconductor chip is thicker than a thickness of one of the first semiconductor chips and a thickness of one of the second semiconductor chips.

3. The device according to claim 1, wherein a thickness of the second portion of the first interlayer semiconductor chip is thinner than a thickness of the first chip group, and the second portion is not in contact with the interconnect substrate.

4. The device according to claim 1, wherein a side surface of the second portion of the first interlayer semiconductor chip opposed to the first chip group is spaced from a side surface of an uppermost first semiconductor chip of the first chip group.

5. The device according to claim 1, further comprising a resin layer provided between the first semiconductor chips, between the second semiconductor chips, between an uppermost first semiconductor chip of the first chip group and the first interlayer semiconductor chip, and between a lowermost second semiconductor chip of the second chip group and the first interlayer semiconductor chip.

6. The device according to claim 5, wherein
a side surface of the second portion of the first interlayer semiconductor chip opposed to the first chip group is spaced from a side surface of the uppermost first semiconductor chip, and
a part of the resin layer is provided between the side surface of the second portion of the first interlayer semiconductor chip and the side surface of the uppermost first semiconductor chip.

7. The device according to claim 1, further comprising a resin part provided on the interconnect substrate and covering the first chip group, the second chip group, the first interlayer semiconductor chip, the first metal wire, the second metal wire, and the third metal wire.

8. The device according to claim 1, wherein the first interlayer semiconductor chip includes a memory element provided in the first portion.

9. The device according to claim 1, wherein
a plurality of the third electrode pads are arranged along one side of the first interlayer semiconductor chip, and
the second portion extends along arrangement direction of the third electrode pads.

10. The device according to claim 1, further comprising:
a third chip group including a plurality of third semiconductor chips stacked in a staircase configuration on the second chip group;
a second interlayer semiconductor chip provided between the second chip group and the third chip group;
a fourth metal wire connecting the third chip group and the interconnect substrate; and
a fifth metal wire connecting the second interlayer semiconductor chip and the interconnect substrate,
each of the plurality of third semiconductor chips including a fourth end part and a fourth electrode pad provided on the fourth end part and bonded with the fourth metal wire, the fourth end part of the third semiconductor chip in a lower stage protruding to a larger extent in the first direction than the fourth end part of the third semiconductor chip in an upper stage, and
the second interlayer semiconductor chip including a third portion, a fourth portion, and a fifth electrode pad, the third portion overlapping the second chip group, the fourth portion protruding in the first direction beyond the second chip group and the third chip group and being thicker than the third portion, the fifth electrode pad provided on the fourth portion and bonded with the fifth metal wire.

11. The device according to claim 10, wherein a thickness of the fourth portion of the second interlayer semiconductor chip is thicker than a thickness of one of the third semiconductor chips.

12. The device according to claim 10, wherein a side surface of the fourth portion of the second interlayer semiconductor chip opposed to the second chip group is spaced from a side surface of an uppermost second semiconductor chip of the second chip group.

13. The device according to claim 10, further comprising a resin layer provided between the third semiconductor chips, between an uppermost second semiconductor chip of the second chip group and the second interlayer semiconductor chip, and between a lowermost third semiconductor chip of the third chip group and the second interlayer semiconductor chip.

14. The device according to claim 10, wherein the second interlayer semiconductor chip includes a memory element provided in the third portion.

15. The device according to claim 10, wherein
a plurality of the fifth electrode pads are arranged along one side of the second interlayer semiconductor chip, and
the fourth portion extends along arrangement direction of the fifth electrode pads.

* * * * *